United States Patent [19]

Varker

[11] Patent Number: 4,732,636
[45] Date of Patent: Mar. 22, 1988

[54] METHOD FOR PRODUCING A PREPREG HAVING IMPROVED DIMENSIONAL STABILITY

[75] Inventor: Kenneth J. Varker, Binghamton, N.Y.

[73] Assignee: International Business Machines Corporation, Armonk, N.Y.

[21] Appl. No.: 866,516

[22] Filed: May 23, 1986

[51] Int. Cl.$^4$ .................. B32B 31/10; B32B 31/18
[52] U.S. Cl. ............................. 156/252; 156/256; 156/307.1; 156/513; 428/136; 428/901
[58] Field of Search .............. 156/252, 253, 250, 257, 156/268, 307.1, 510, 513, 84, 85, 148; 26/18.5, 18.6, 19, 24; 428/136, 225, 228, 258, 901, 179

[56] References Cited

U.S. PATENT DOCUMENTS

| | | | |
|---|---|---|---|
| 2,055,002 | 9/1936 | Chandler | 18/55 |
| 3,307,961 | 3/1967 | Stiehl et al. | 427/243 |
| 3,558,423 | 1/1971 | Rossetti, Jr. | 428/251 |
| 3,660,199 | 5/1972 | Riccitiello et al. | 156/306 |
| 4,372,347 | 2/1983 | Olson | 139/420 |
| 4,388,136 | 6/1983 | Huie et al. | 156/252 |
| 4,428,995 | 1/1984 | Yokono et al. | 428/193 |

Primary Examiner—Donald E. Czaja
Assistant Examiner—Lori Cuervo
Attorney, Agent, or Firm—Mark Levy; Max Kenemore

[57] ABSTRACT

Shrinking of partially cured or B-staged resin coated fabric, also known as prepreg, during C-staging or full curing is reduced by cutting at least a plurality of the warp of the fabric in at least one location before C-staging. Prepreg is useful in the computer industry in the manufacture of printed circuit boards.

14 Claims, 4 Drawing Figures

METHOD FOR PRODUCING A PREPREG HAVING IMPROVED DIMENSIONAL STABILITY

BACKGROUND OF THE INVENTION

1. Field of the Invention

This invention relates generally to the field of manufacturing resin impregnated fabric articles and more specifically to the manufacture of such articles which are useful as dielectric substrates in printed circuit boards and to improvements in said manufacturing which avoid shrinking of the articles during final curing of the resin.

2. Prior Art

It has long been known to use resin impregnated fabric, more commonly known as prepreg, as a dielectric substrate in the manufacture of printed circuit boards.

In a typical process, the fabric, which may be made from any suitable material, is coated with a curable resin. The resin is then partially cured, or "B-staged", in order to provide substantially planar cards or boards of prepreg which can be used to construct a printed circuit board. Typically the prepreg comprises glass cloth impregnated with an epoxy resin as is shown in U.S. Pat. No. 3,660,199 to Riccitiello et al.

Often, prior to personalization of the printed circuit board, the prepreg components are laminated together to form thicker dielectric layers and are sometimes sandwiched between layers of a conductive material. The conductive layers are then sometimes covered with additional layers of prepreg to form buried conductive layers.

It is also typical in the manufacture of printed circuit boards having one or many layers to make holes, known as through holes, completely through the printed circuit board. The holes are made by a variety of techniques such as drilling or laser cutting. They may be plated with a conductive material for use in electrical communication between the sides of the printed circuit board or they may be used to receive pins of components which are plugged into the printed circuit board.

Finally the prepreg or the drilled laminate is fully cured or "C-staged". C-staging after lamination helps to improve laminar adhesion in printed circuit boards comprising layers of prepreg. The C-staged prepreg or laminate is then normally personalized on at least one side with an electrically conductive circuit, which may be applied by any of a variety of well-known techniques, such as silk screen printing or photomasking combined with plating and etching.

It has been a problem with prepreg made by the process described above, especially when B-staged by heating in a vertical curing oven, that the prepreg shrinks during C-staging. Such shrinking is more dramatic when the prepreg is B-staged in a vertical drying oven, although it is also noted when the prepreg is B-staged in a horizontal oven. It is believed that the weight of the resin coated web as it is pulled up the vertical curing oven or through a horizontal oven stresses the warp of the fabric. It is believed that during C-staging the forces exerted by the warp in trying to recover from this stress causes the prepreg to shrink in a direction parallel with the warp.

Such shrinking causes through holes drilled in the prepreg, or in a laminated substrate comprising such prepreg, to move toward the center of the board during C-staging.

Coping with this problem has been a major factor in the production of printed circuit boards. Generally the shrinkage is compensated for by the complex and imprecise technique of anticipating shrinkage, such as by making through holes in locations other than where they are ultimately desired in anticipation that they will move to the desired location.

There is a need for prepreg which demonstrates reduced shrinkage during C-staging.

SUMMARY OF THE INVENTION

It is an object of the present invention to overcome this problem of the prior art.

It is also an object of the present invention to reduce shrinkage of prepreg during C-staging.

These and other objects are accomplished by the present invention which, in one aspect, relates to an improvement in the method for making substantially planar constructions of resin-impregnated fabric, which method comprises the steps of (1) coating the fabric with a curable resin, (2) partially curing the resin and (3) fully curing the resin. The improvement comprises, between steps (2) and (3), cutting at least a plurality of the warp of the fabric in at least one location, whereby shrinkage of the construction during step (3) is reduced.

In another aspect, the present invention relates to a substantially planar construction comprising resin-impregnated fabric wherein at least a plurality of the warp of the fabric has been cut in at least one location.

In yet another aspect, the present invention relates to a printed circuit board comprising a central core of laminated multiple layers of the construction described above sandwiched between layers of a conductive metal which are in turn covered by at least one outer layer of said construction. At least one of the outer layers has placed thereon an electrically conductive circuit, and a pattern of through holes has been made in the printed circuit board.

DETAILED DESCRIPTION OF THE INVENTION

It has been discovered that cutting at least a plurality of the warp of the resin-impregnated fabric in at least one location while the resin is in a partially cured state will surprisingly reduce the shrinkage of the prepreg during C-staging.

Figure 1:
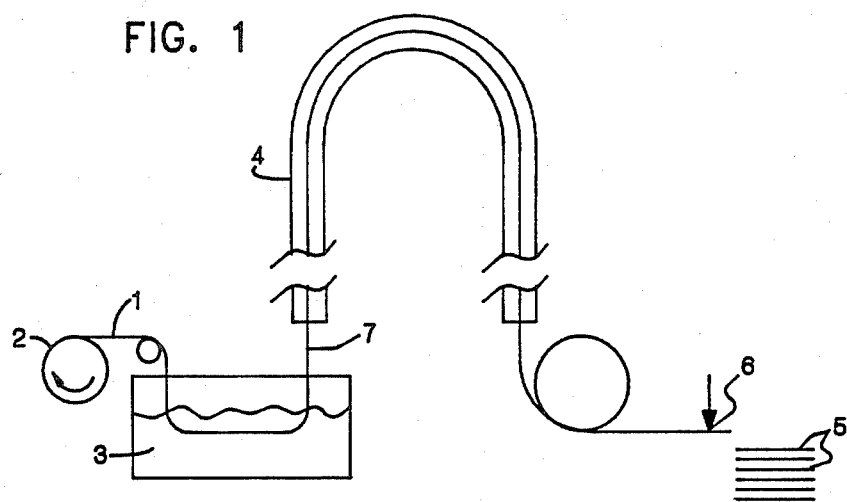
FIG. 1 shows schematically and in cross-section an apparatus for making prepreg.

Referring more specifically to FIG. 1, there is shown a greatly simplified apparatus for coating a fabric with resin and for B-staging the coated fabric.

Fabric 1 is unwound from supply roll 2 and dipped into a curable liquid resin 3 before entering curing oven 4 where the liquid coated fabric is partially cured, usually by forced hot air.

Any useful fabric and resin may be employed. The particular type of resin and fabric used are not critical to the operation of the invention. Typically, fabric 1 is glass cloth and resin 3 is an epoxy or polyimide resin.

After exiting curing oven 4, the partially cured resin impregnated fabric, known as prepreg, is cut into panels 5 by cutter or slitter 6.

It is believed that the weight of the resin coated fabric 7 stresses the warp of fabric 1 as it is drawn up vertical curing oven 4, as explained above. Such stressing also occurs in systems having horizontal curing ovens (not shown), but to a lesser degree.

Figure 2:
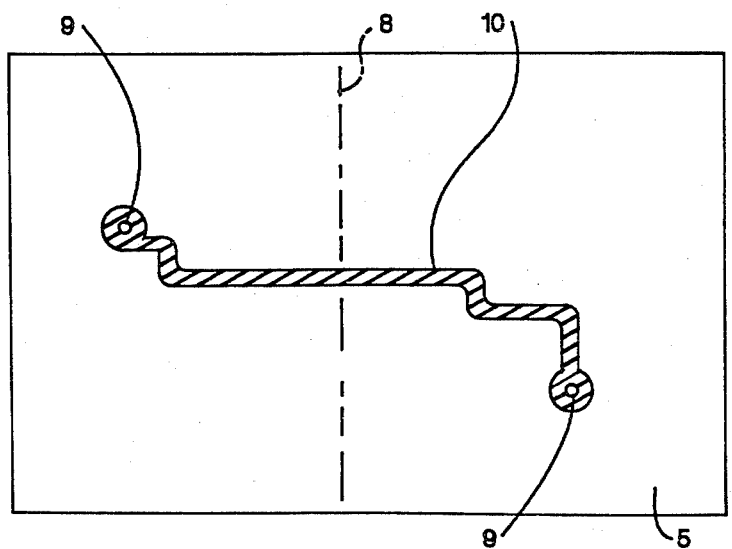
FIG. 2 shows a top view of a B-staged printed circuit board made employing the present invention.

Referring more specifically to FIG. 2, there is shown a top view of a B-staged panel 5. A single, non-continuous line of cuts 8 has been made in the warp of the fabric which forms the core of panel 5. The warp of the fabric runs lengthwise of the panel. The cuts do not have to be in a line perpendicular to the warp as shown in FIG. 2, although such a configuration is normally preferred because of manufacturing convenience. The cuts could be at random locations or, for example, in a diagonal line or a curve. It is important to the operation of the invention that at least a plurality of the warp be cut in at least one location, but the pattern of the cuts in the warp is not critical.

Cuts 8 part just over half of the warp in panel 5. As will be more fully described in the following Example, it has been found that cuts in at least a plurality of the warp of the fabric in at least one location, one embodiment of which is shown in FIG. 2, will reduce the shrinkage of prepreg more than 20% during C-staging.

Cuts 8 may be made by any useful means. The means of making cuts 8 is not critical to the invention. For example, a knife edge, a laser or a roller embossed with a pattern of knife edges may be used. The cutting means normally cuts through the resin coating on one side of the fabric and through the warp of the fabric, leaving a slit in the resin which is "healed" during C-staging.

Through holes 9 and electrically conductive circuit 10 are applied to panel 5 by conventional and well known means which are described in the literature and which will not be repeated here. Normally through holes 9 are made before C-staging and circuit 10 is applied after C-staging.

Figure 3:
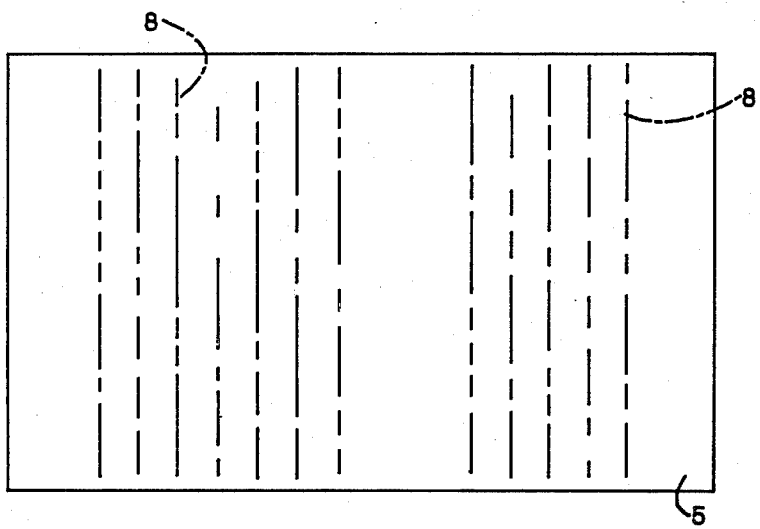
FIG. 3 shows a top view of a B-staged printed circuit board made employing a preferred embodiment of the present invention.

Referring more specifically to FIG. 3, there is shown panel 5 in which 12 non-continuous cuts 8 have been made across a plurality of the warp of the fabric. As is discussed in more detail in the following Example, the number of cuts 8 shown in FIG. 3 provide about an 80% reduction in shrinkage of the prepreg during C-staging. Although it is not shown in this figure, either or both surfaces of panel 5 may be personalized with electrically conductive circuitry and through holes may be made in the panel, as is shown in FIG. 2.

Figure 4:
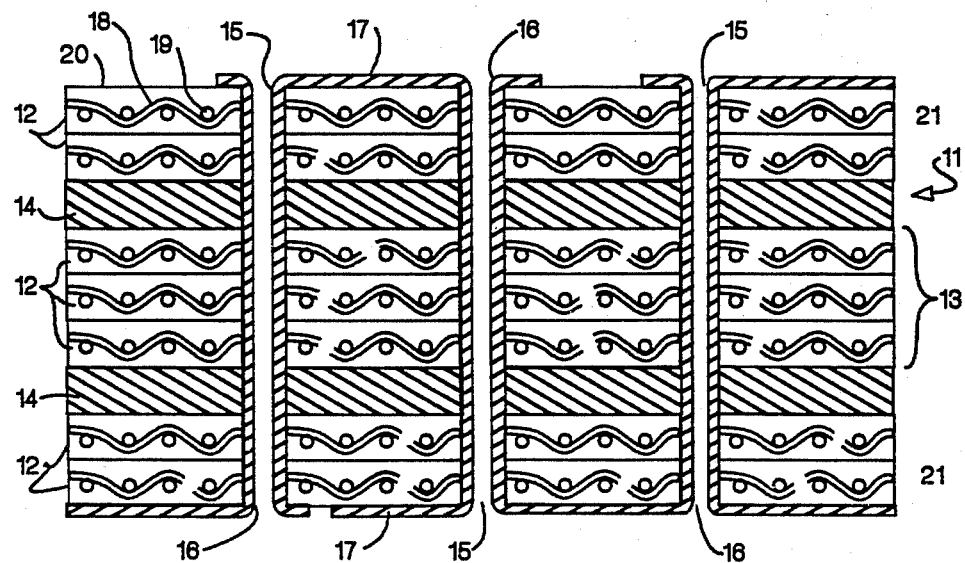
FIG. 4 shows schematically and in cross-section a printed circuit board made in part of laminated layers of prepreg employing the present invention.

Referring more specifically to FIG. 4, there is shown printed circuit board 11 which is made using the construction of the present invention. Printed circuit board 11 comprises a central core 13 of three laminated layers of prepreg 12 which includes the improvement of the present invention. Conductive layers 14 are on either side of central core 13 and are in turn covered by two additional layers of prepreg 12. Through holes 15 have been drilled through printed circuit board 11 and have been plated with an electrically conductive metal in order to enable electrical communication between printed circuits 17, which have been applied to both sides of printed circuit board 11.

Warp 18 and weft 19 of the fabric of prepreg 12 is shown impregnated in resin 20. Cuts 21 in warp 18 are also shown greatly enlarged for purposes of illustration. Resin 20 around cuts 21 has healed during C-staging of printed circuit board 11 so that no slits in the resin remain.

Laminating of the various layers shown in FIG. 4, the deposition of a conductive metal on a dielectric resin and the drilling of through holes through multiple layers are well-known techniques in the art of making printed circuit boards.

The invention will be further illustrated by the following example.

EXAMPLE

A dielectric substrate, also known as prepreg, for use in the manufacture of printed circuit boards was made by dip-coating a 24.25 inch-wide web of glass cloth, commercially available from Uniglass as Style 109 Glass Cloth, in a heat curable epoxy resin, commercially available from Ciba Geigy as FR 4. An Egan treater was used.

The glass cloth, coated with uncured epoxy resin was run through a 300° F. vertical curing oven for 2 minutes to accomplish partial curing or "B-staging", of the resin. After leaving the oven, the web was cut into 28.25 inch-long boards by a Moore & White slitter.

The boards were used to make constructions having three layers of prepreg sandwiched between 0.0028 inch copper layers which were in turn covered by two layers of prepreg. A pattern of about 2,500 through holes which is commonly used in the manufacture of printed circuit boards was drilled in nine such constructions, numbered 1 through 10, and the x and y locations of 30 of the through holes was recorded for future comparison.

Construction No. 1

No cuts were made in Construction No. 1. It was fully cured, or "C-staged", at 350° F. for an hour under 500 psi uniform pressure applied by a hydraulic press, and the x and y locations of the same 30 through holes were once again recorded and compared to their original locations. The outermost holes, near the 24.25 inch-wide edge of the board and located about 9 inches from the centerline of the board, were found to be drawn toward the centerline of the board, the movement being parallel to the 28.25 dimension, by about 0.005 inch. The holes nearer the center of the board were drawn toward the center of the board by a lesser distance.

For uniformity of comparison from board to board, this movement may be expressed as parts movement per million parts distance from the hole location to the centerline of the board (ppm). In the case of Construction No. 1, there were 550 parts movement for each million parts distance, or 550 ppm.

Construction No. 2

Construction No. 2 was made, drilled and measured as in connection with Construction No. 1 except that each prepreg component of Construction No. 2 was subjected to one non-continuous cut across its warp by an exacto knife prior to assembly. The exacto knife was positioned to cut through the partially cured resin to a depth sufficient to part the warp of the glass cloth and was manipulated to cut only just over half of the warp in each component. An open slit the width of the knife thickness was also left in the resin at positions where the warp was cut.

Construction No. 2 was C-staged and the x and y locations of the same 30 through holes were recorded and compared to their locations before C-staging. Movement of the holes was reduced to about 420 ppm, a reduction of over 23%.

It was observed in Construction No. 2 and in Constructions 3 through 10, described below, that after C-staging the cut left in the resin by the exacto knife had been "healed", in most cases without a visible trace.

Construction No. 3

Each prepreg component of Construction No. 3 was subjected to two separate non-continuous cuts along the warp of the glass cloth. The cuts were evenly spaced to divide each component substantially in thirds and, as in Construction No. 2, each cut separated just over half of the warp. After being subjected to the same measurements and comparisons as Constructions 1 and 2, it was observed that in Construction 3 the migration of the holes was reduced to about 350 ppm, a reduction of over 36%.

Construction No. 4

Each prepreg component of Construction No. 4 was subjected to three separate non-continuous cuts along the warp of the glass cloth. The cuts were evenly spaced along the length of the component and, as before, parted just over half the warp. After being subjected to the same measurements and comparisons as Constructions 1 through 3, it was observed that in Construction No. 4 the movement of the through holes during C-staging was about 200 ppm, a reduction of over 63%.

Construction No. 5

Each prepreg component of Construction No. 5 was subjected to six separate non-continuous cuts along the warp of the glass cloth. The cuts were evenly spaced along the length of the component and, as before parted just over half the warp. After being subjected to the same measurements and comparisons as Constructions 1 through 4, it was observed that in Construction No. 5 the movement of the through holes during C-staging was about 180 ppm, a reduction in shrinkage of about 67%.

Construction No. 6

Each prepreg component of Construction No. 6 was subjected to nine separate non-continuous cuts along the warp of the glass cloth as in the previous Constructions 2 through 5. After being subjected to the same measurements and comparisons as Constructions 1 through 5, it was observed that in Construction No. 6 the movement of the through holes during C-staging was about 150 ppm, a reduction in shrinkage of about 70% over the shrinkage of Construction 1.

Construction No. 7

Each prepreg component of Construction No. 7 was subjected to 12 separate non-continuous cuts along the warp of the glass cloth as in previous Constructions 2 through 6. After being subjected to the same measurements and comparisons as Constructions 1 through 6 it was observed that in Construction No. 7 the movement of the through holes during C-staging was about 100 ppm, a reduction in shrinkage of about 80% over the shrinkage of Construction 1.

Construction No. 8

Each prepreg component of Construction No. 8 was subjected to 15 separate non-continuous cuts along the warp of the glass cloth. As in previous constructions 2 through 7, the cuts parted just over half the warp in each component. After being subjected to the same measurements and comparisons as Constructions 1 through 7, it was observed that in Construction No. 8 the movement of the through holes during C-staging was about 100 ppm, a reduction in shrinkage of about 80% over the shrinkage of Construction 1, but no further improvement over the the shrinkage of Construction No 7.

Constructions No. 9 and No. 10

Each prepreg component of Construction No. 9 was subjected to three separate non-continuous cuts along the warp of the glass cloth and three separate such cuts along the weft of the glass cloth. Each prepreg component of Construction No. 10 was subjected to 15 separate such cuts along the warp and 15 separate cuts along the weft of the glass cloth. Each cut parted just over half of the warp or weft.

After being subjected to the same measurements and comparisons as Constructions 1 through 8 it was observed that Construction No. 9 showed only marginally less movement of through holes than Construction No. 4 during C-staging and that Construction No. 10 showed no additional reduction in movement of through holes than Construction No. 8.

It will be clear to one of ordinary skill in the printed circuit board technology after reading the preceding Example that the improvement of the present invention can be used to reduce shrinkage or movement of through holes in prepreg and in printed circuit boards of a variety of sizes, comprising a variety of layers of prepreg and other materials and whenever said prepreg is made from a variety of resins and fabrics. It will also be apparent to such a technician that cutting of the fabric can be accomplished by a number of other methods, such as laser cutting or the use of a roller embossed with a pattern of knife edges.

The present invention has been disclosed in the above teachings and in the accompanying drawings with sufficient clarity and conciseness to enable one skilled in the art to make and to use the invention, to know the best mode for carrying out the invention and to distinguish it from other inventions and from what is old. Many variations and obvious adaptations of the invention will readily come to mind, and these are intended to be contained within the scope of the invention as claimed below.

What is claimed is:

1. A method for manufacturing substantially planar panels of resin-impregnated fabric, whereby shrinkage thereof during manufacture is reduced, the steps comprising:
    (a) providing a substantially planar fabric having a warp;
    (b) coating said fabric with a curable resin;
    (c) partially curing said resin;
    (d) cutting said partially cured resin-impregnated fabric into panels having outer boundaries;
    (e) after said partial curing step, transversely cutting at least a plurality of said fabric warp within said outer boundaries of said panels at at least one location; and (f) after transversely cutting said fabric warp, fully curing said resin.

2. The method in accordance with claim 1 wherein portions of the weft of said fabric are also cut.

3. The method in accordance with claim 1 wherein said warp is cut along at least one line which is substantially perpendicular thereto.

4. The method in accordance with claim 3 wherein said warp is cut completely through at noncontiguous locations.

5. The method in accordance with claim 1 wherein, after said warp cutting step (e) and prior to said fully curing step (f), the substantially planar panel is laminated with at least one other planar member selected from the group consisting of other substantially similar panels and a conductive metal in order to form a laminate.

6. The method in accordance with claim 1 wherein prior to said fully curing step (f) at least one through hole is made in said panel.

7. The method in accordance with claim 6 wherein a pattern of through holes is made.

8. The method in accordance with claim 5 wherein after lamination and before said fully curing step (f) at least one through hole is made in said laminate.

9. The method is accordance with claim 1 wherein a printed circuit is applied to at least one surface of said panel.

10. The method in accordance with claim 5 wherein said laminate has at least one outer surface of said substantially similar panel having a printed circuit applied thereto.

11. The method in accordance with claim 1 wherein said warp cutting step (e) is accomplished by a knife edge.

12. The method in accordance with claim 1 wherein said warp cuting step (e) is accomplished by the application of laser radiation.

13. The method in accordance with claim 1 wherein the fabric comprises a glass cloth.

14. The method in accordance with claim 1 wherein said curable resin comprises an epoxy resin curable by heat.

* * * * *